United States Patent [19]
Southard

[11] 3,977,291
[45] Aug. 31, 1976

[54] ATTENUATOR NETWORK FOR MUSICAL INSTRUMENT KEYING SYSTEM

[75] Inventor: James S. Southard, Union, Mich.

[73] Assignee: C. G. Conn, Ltd., Elkhart, Ind.

[22] Filed: Aug. 13, 1974

[21] Appl. No.: 496,943

[52] U.S. Cl. .................. 84/1.13; 84/1.26;
307/237; 323/73; 323/79; 323/80; 323/81;
328/75
[51] Int. Cl.² .................. G10H 1/02; H01P 1/22
[58] Field of Search .................. 84/1.01, 1.09, 1.1,
84/1.13, 1.26, 1.27; 323/73, 74, 79, 80, 81,
94 R; 307/221 C, 237; 328/37, 75

[56] References Cited
UNITED STATES PATENTS

| | | | |
|---|---|---|---|
| 2,892,147 | 6/1959 | Bell | 323/79 |
| 2,999,202 | 9/1961 | Ule | 323/74 |
| 3,011,132 | 11/1961 | Hinrichs et al. | 323/79 X |
| 3,333,183 | 7/1967 | Larrison | 323/80 X |
| 3,590,366 | 6/1971 | Vaughn | 323/74 |
| 3,617,959 | 11/1971 | Brander | 323/79 X |
| 3,796,945 | 3/1974 | Feldman et al. | 323/74 |
| 3,819,844 | 6/1974 | Isii | 84/1.26 |
| 3,821,714 | 6/1974 | Tomisawa et al. | 84/1.01 X |
| 3,844,379 | 10/1974 | Tomisawa et al. | 84/1.01 |
| 3,854,365 | 12/1974 | Tomisawa et al. | 84/1.01 |

*Primary Examiner*—L. T. Hix
*Assistant Examiner*—Stanley J. Witkowski
*Attorney, Agent, or Firm*—Drummond, Nelson & Ptak

[57] ABSTRACT

A digital keying system for an electronic organ comprises a voltage divider network consisting of weighted value resistors switched into or out of the circuit by corresponding switches. The network is connected to a tone signal output terminal, and a reversible counter is connected to control the states of conduction of the switches. Closure of a key-operated switch causes clock pulses from an attack clock pulse source to be applied to the reversible counter to selectively control the operation of the switches to shape the attack waveform of tone signals appearing on the output terminal as determined by the pattern of operation of the switches. Upon release of the key, clock pulses from a decay clock generator are applied to the counter to operate it in the reverse direction, establishing a decay envelope for the tone signal in accordance with the pattern of operation of the switches. Provisions are made for terminating the application of clock pulses in either direction when a maximum count for that direction has been reached by the counter.

18 Claims, 3 Drawing Figures

3,977,291

ATTENUATOR NETWORK FOR MUSICAL INSTRUMENT KEYING SYSTEM

BACKGROUND OF THE INVENTION

In electronic organs and similar electronic tone producing devices of the key actuated type, it has been the practice to employ circuit arrangements for modifying the decay times of tones upon release of a key. This is done to produce percussion effects or to provide natural sounding tone effects representative of other instruments where the termination of a tone signal is not abrupt, but rather decays in amplitude at a rate determined by the particular effect which is being reproduced by the organ. In the past, it has been common to utilize resistive-capacitive (RC) networks for establishing the desired time delays to create such effects. The capacitors in such timing circuits have relatively large values of capacitance, and it has been necessary to use large numbers of such RC circuits corresponding to the number of keyers used in the instrument. Variations in tolerances of such capacitors make it difficult to consistently reproduce the same effects from one instrument to another. Similar difficulty also is encountered within the same instrument in obtaining uniform decay characteristics among the various keys used in the instrument when RC delay circuits are used.

Another advantage of the use of such RC timing circuits in electronic musical instruments is that at the present state-of-the-art it is not economically feasible to form large value capacitors as part of integrated circuits. Thus, if integrated circuitry is used for other portions of the logic function of such an electronic instrument, it still is necessary to employ discrete capacitors. This requires additional bonding pads on the integrated circuits reducing the usable chip area and also increases manufacturing cost because of the hybrid nature of the circuitry.

Another problem is encountered when it is desired to vary the RC time constants for the purpose of changing the decay envelope of a tone in response to operation of a key activated control switch. Variable capacitors and variable resistors can be employed to permit adjustments of the time delay characteristics of the RC circuits, but this in turn increases the cost of these components. At the same time the consistent reproducability from instrument to instrument and within a given instrument is made increasingly difficult, particularly if reasonable costs in the manufacture of the instrument are to be achieved.

In addition, the use of timing networks tends to introduce unwanted clicks or pops into the reproduced tones whenever the keys are operated to close and open the switches controlled by the key. These audible noises are distracting, and obviously reduce the quality of the music produced by the instrument.

Accordingly, it is desirable to eliminate, to as great an extent as possible, the RC time delay networks in a musical instrument such as an electronic organ and to replace the time delay functions with other types of attenuator networks which do not require large timing capacitors, which are capable of fabrication in integrated circuit form, and the time delay characteristics of which can be readily varied in accordance with the desires of the designer of the instrument and the musician who plays it.

SUMMARY OF THE INVENTION

Therefore, it is an object of this invention to provide an improved attenuator network for varying the attenuation of signals.

It is another object of this invention to provide an improved keying system for an electronic musical instrument.

It is an additional oject of this invention to provide a variable attenuator network for varying the attenuation of signals according to a predetermined pattern and in which the attenuation rate can be easily changed.

It is a further object of this invention to provide a digital keying system for an electronic musical instrument which is adaptable for fabrication in integrated circuit form.

It is yet another object of this invention to provide a digital keyer circuit for an electronic musical instrument and the like in which a variable attenuator network is used in conjunction with a reversible counter to shape both the attack and decay portions of the tone output waveform.

In accordance with a preferred embodiment of this invention, an attenuator network for varying the attenuation of signals according to a predetermined pattern includes a voltage divider network coupled with the output terminal of a tone signal path to which signals are applied on an input terminal. The voltage divider network includes a number of resistor elements and a corresponding number of switch elements, each of which are connected with a different one of the resistor elements for effectively varying the signal attenuation between the input and output terminals depending upon the state of operation of the switch elements. A counter circuit is operated in response to clock pulses and has several stages, each of which is coupled to control the operation of a different one of the switch elements in accordance with the pattern of output signals obtained from the stages of the counter. Application of clock pulses to the counter circuit is controlled by a key operated control switch.

In more specific versions of the network, the resistor elements have different values of resistance to provide different amounts of attenuation to the signals appearing on the output terminal. The pattern of the resistor values is arranged to conform with the binary output of the counter to cause the attenuation to decrement or increment in an equal DB progression or programmed DB progression.

For control of both attack and decay tone characteristics, a bi-directional reversible binary counter is employed. One source of clock pulses controls the rate of attack of the waveform when a key operated control switch is closed; and another source of clock pulses controls the rate of decay of the waveform when the key operated control switch is opened. A provision also is made in a specific application of the circuit for pre-establishing an initial attenuation condition and attack shape by an additional attack memory circuit which is activated upon closure of the key operated control switch.

DETAILED DESCRIPTION

Figure 1:
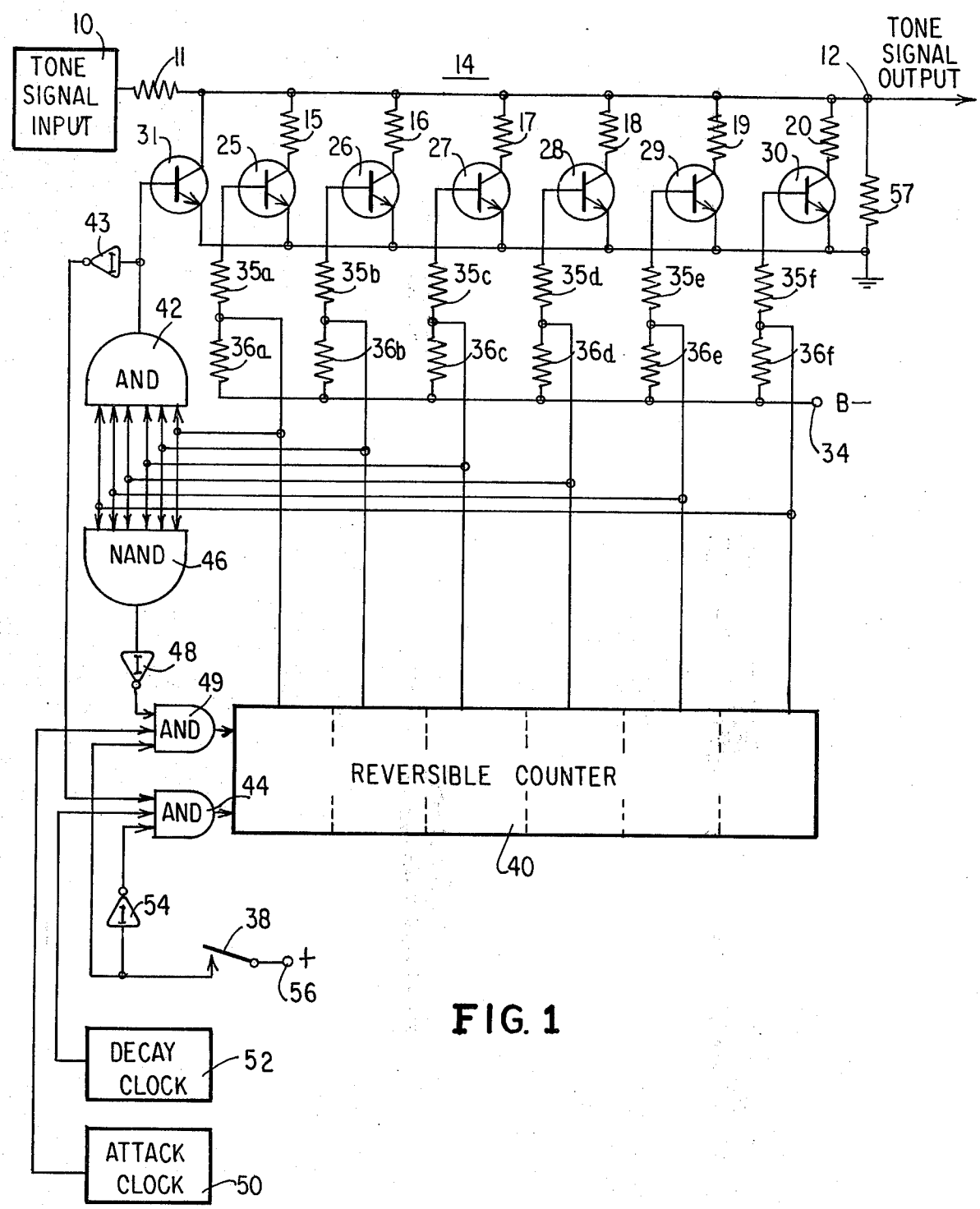
FIG. 1 is a schematic circuit diagram of an embodiment of the invention.
Figure 2:
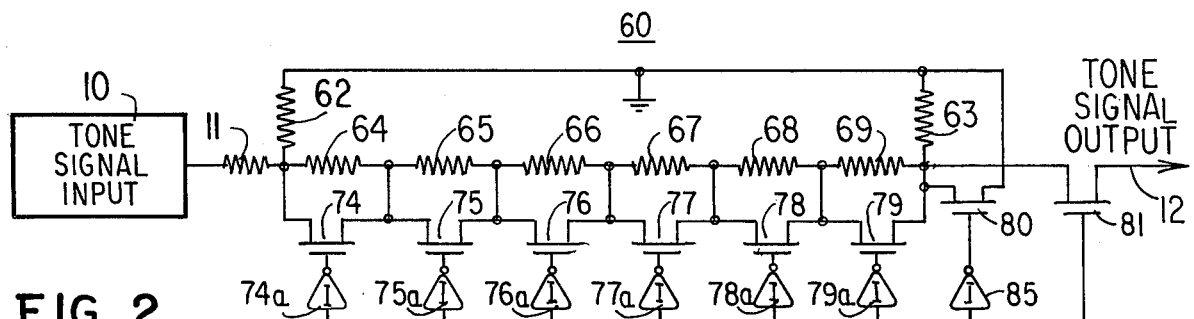
FIG. 2 is a schematic diagram of another embodiment of the invention.
Figure 2:
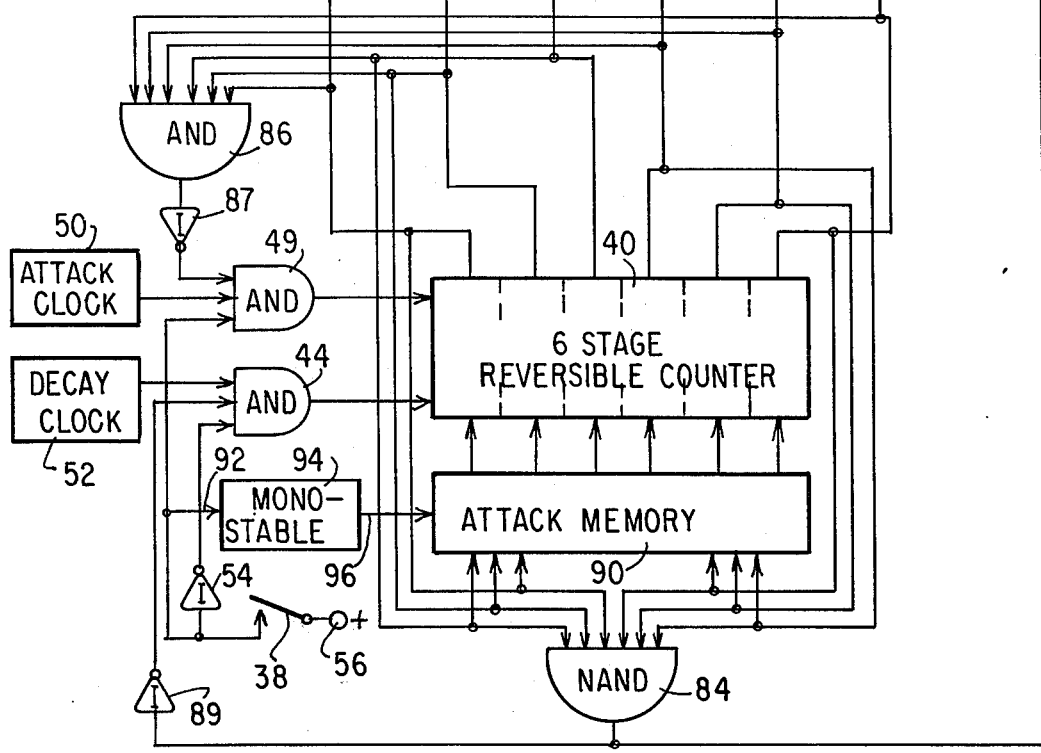

Referring now to the drawings, FIGS. 1 and 2 show digital keyers particularly adapted for use in electronic organs in which a variable attenuator network is operated by depression and release of the organ key to shape the attack and decay envelopes of the tones supplied from a tone generator to the output of the organ. The keyer attack time is controlled by an attack frequency which is generated by an attack clock circuit. Similarly, the decay time of the tone signal output, and the shape of the decay waveform is controlled by a decay frequency which is generated by a decay frequency clock circuit. Different attack and decay frequencies may be chosen for different attack, decay or sustain effects, depending upon the desired characteristics of the tone which is to be reproduced by the system.

A high attack frequency from the attack clock means a fast attack, since it takes less time for the tone signal output to build up from zero or fully attenuated value to its maximum level, at which the tone supplied by the tone signal generator to the output has minimum attenuation. Chiff keyers have the fastest attack in an electronic organ, using a clock frequency of approximately 13.57 kilohertz. A low attack frequency means a slow attack, such as the attack frequencies used for the lowest notes of the flute keyers, typically 430 hertz.

Similarly, different decay freqencies from the decay clock generator are employed depending upon the effect which is to be reproduced. A high decay frequency means that the keyer turns off in a short time, whereas a low decay frequency may stretch out the decay time to several seconds. Generally the chiff, celeste and pulse keyers have fixed decay frequencies provided from the decay clock assemblies which are associated with these keyers. Flute keyers on the other hand, need to be adjustable to follow decay times which are selected by tabs for reverberation, sustain or chime. Typical flute decay frequencies for shaping the decay waveform of the systems shown in FIGS. 1 and 2 have been found to be approximately 800 hertz normally, 108 hertz for reverberation, 27 hertz for sustain, and 13.5 hertz for chime.

The manner in which these attack and decay clock frequencies function with the circuits shown in FIGS. 1 and 2 to provide the desired attack and decay shaping of the tone signal waveforms will be more readily understood in conjunction with the description of operation of the digital keyer attenuator networks shown in these figures.

Referring now particularly to FIG. 1, there is illustrated, partially in block diagram form, an attenuator network and control circuitry for shaping the attack and decay waveforms of the tones produced in a keying circuit for an electronic musical instrument. The tones are generated by a suitable tone signal generator indicated as a tone signal input circuit 10, and these tones are supplied through a coupling resistance 11 to a tone signal output terminal 12. An attenuator network 14, which is illustrated as a variable parallel voltage divider network, is coupled between ground or a point of reference potential and the output terminal 12 at its junction with the resistor 11.

The divider network 14 of FIG. 1 comprises six resistors 15, 16, 17, 18, 19 and 20, each connected in series with a different NPN transistor switch 25, 26, 27, 28, 29 and 30, respectively. When all of the transistor switches 25 to 30 are nonconductive, the tone signals appearing on the output terminal 12 are at a maximum amplitude level. When one or more of the transistor switches 25 to 30 are conductive, a portion of the tone signals applied through the resistor 11 is shunted to ground through the corresponding resistor 15 to 20 to reduce the amplitude of the signal on the tone signal output terminal 12. All of the transistors 25 to 30, however, are normally biased nonconductive by the application of a reverse bias direct current potential applied to a terminal 34 which is connected to the bases of each of the transistors 25 to 30 through similar coupling resistance networks each consisting of a pair of resistors 35a/36a to 35f/36f, respectively Preferably the resistors 15 through 20 are of different weighted values to permit the selective connection of these resistors between ground and the output terminal 12 in accordance with a predetermined binary-weighted pattern to selectively control the attack and decay wave-shapes of the signals on the output terminal 12.

In the circuit shown in FIG. 1, the conductivity of each of the transistors 25 to 30 is controlled by a different stage of a reversible binary counter 40. The output of each stage of the counter 40 is coupled to the junction of a different one of the pairs of resistors 35a/36a to 35f/36f, respectively, in the base circuit of the transistors 25 to 30. For example, the first stage of the counter 40 is coupled to the base of the transistor 25 at the junction of the resistors 35a and 36a and the last stage is coupled to the base of the transistor 30 at the junction of the resistors 35f and 36f, with intermediate stages of the counter coupled to corresponding intermediate ones of the transistors 26 to 29. In the quiescent condition of operation when a key operated switch 38 for the keyer is not operated, the status of the reversible counter 40 of FIG. 1 is such that a high or positive output is obtained from all six stages. This causes all of the transistors 25 to 30 to be forward biased, connecting the shunt resistance paths of all of the resistors 15 to 20 in parallel across the tone signal output terminal 12. This reduces the tone signal output on the terminal 12 to a point where it is ineffective or cannot be heard. Typically, this is in the range of 70 to 80 decibels down from the maximum level attainable on the terminal 12.

When the counter 40 is in this state of operation, with a high output obtained from all of its stages, a high output also is obtained from an AND gate 42, having six inputs coupled to the six different outputs of the counter 40. This output is inverted by an inverter 43 to a low output applied to an AND gatd 44 which operates to control the counter in its "up" count direction, thereby disabling the AND gate 44 until the count on the counter changes to any other count, at which time the AND gate 44 is enabled. The high output of the AND gate 42 also is applied to the base of an NPN shunting transistor 31 to render it conductive to effectively connected the output terminal 12 to near ground potential. This assures that no tone signals reach the terminal 12 for this "off" condition of the keyer system.

A NAND gate 46 also has six inputs coupled to the outputs of the reversible counter; and since these outputs are high at this time, the output of the NAND gate 46 is low. This output is inverted by an inverter 48 to a high output which is applied to enable a three input AND gate 49 coupled to the "down" count input of the reversible counter 40.

The AND gate 49 is used to apply attack clock counting pulses to the reversible counter from an attack clock generator 50 which operates at the desired frequency of the attack clock pulses to shape the leading or attack part of the waveform when the key 38 is closed.

Similarly, the decay clock wave-shape is controlled by clock pulses generated by a decay clock generator 52 which has its output coupled to one of the three inputs of the AND gate 44. The other two inputs of the AND gates 44 and 49 are connected to the key 38. The input to the AND gate 49 is connected directly to the key 38 and the key input for the AND gate 44 is connected through an inverter 54. Thus, when the key 38 is open or released, the inverter 54 applies a high or enabling potential to the AND gate 44, while the corresponding input to the AND gate 49 is low, and vice-versa.

When the key 38 is closed with the state of conditions for the counter 40 as described above, that is, all stages producing a high output, the closure of the key 38 applies a positive potential from a suitable source of potential (not shown) on the terminal 56 to enable the AND gate 49 and disable the AND gate 44. Since both enabling inputs to the AND gate 49 are high at this time, the clock pulses produced by the attack clock generator 50 are passed by the AND gate 49 to the "down" input of the reversible counter 40. This causes the counter to commence counting down from its maximum or full count (binary number 63 for a six stage counter) at a rate determined by the frequency of the pulses applied by the attack clock generator 50. This rate can be varied in accordance with the effect which is desired to be produced. For example, as stated previously, for a chiff keyer a relatively high frequency attack clock pulse rate is used, whereas for the lowest notes of the flute keyers a relatively low frequency is employed. The frequency may be selected in accordance with the desired results to be obtained.

As the counter reverses from its maximum count sequentially downward to a count of zero, the six output stages of the counter apply different patterns of high and low outputs to the bases of the corresponding switching transistors 25 to 30. On the very first reverse count of the counter 40 and for all subsequent counts in the reverse direction, the output of the AND gate 42 goes low, reverse biasing the shunting transistor switch 31 to turn it off to remove the ground potential from the tone signal output terminal 12. At the same time, this low output is inverted by the inverter 43 to a high enabling input for the AND gate 44 to prepare the AND gate 44 to pass the decay clock pulses whenever the key 38 subsequently is released. So long as the key 38 remains closed, however, the inverter 54 applies a low or disabling input to the AND gate 44 so that it is of no consequence in the operation of this circuit during the attack waveform shaping. The output of the NAND gate 46 remains low, since for all counts of the reversible counter 40 except "zero", there is at least one output which is high. This low output is inverted by the inverter 48 to continue to enable the AND gate 49.

The AND gate 49 thus passes the clock pulses continuously until the reversible counter reaches its count of "zero". When this count is attained, the output of the NAND gate 46 then goes high, since all of its inputs are low. This high output is inverted by the inverter 48 to a low output, and the AND gate 49 is disabled to prevent passage of further attack clock pulses to the reversible counter 40. The circuit then remains in this state of operation with all outputs of the counter 40 low, which means that all of the switching transistors 25 to 30 and the transistor 31 are biased to their nonconductive state and the tone signals on the output terminal 12 are at their maximum amplitude. These signals appear across an output load impedance 57.

During the time that the reversible counter 40 is counting down from its highest count to its minimum count, different ones of the resistors 15 through 20 in various combinations are connected in parallel between ground and the tone signal output terminal 12. Relative values of the resistors 15 to 20 are selected in accordance with binary weighted representations preferably to cause the tone signal output attenuation to be reduced in one decibel steps in direct correspondence with the count in the counter 40. It has been found thhat the human ear does not detect such one decibel steps, and the attack appears to vary to the listener from a point where the tone signal is at maximum attenuation (off) to minimum attenuation (off) to minimum attenuation (maximum amplitude level) in a continuous manner.

So long as the key 38 remains held down, the tone signal output appearing on the terminal 12 continues at its maximum sustain amplitude. When the key 38 subsequently is released or opened, the enabling potential is removed from the lower input of the AND gate 49, insuring that no pulses are passed by this gate; and the inverter 54 applies an enabling potential to the third input of the AND gate 44. Since the potential from the inverter 43 at this time also is high, the AND gate 44 operates to pass the clock pulses from a decay clock generator 52 to the "up" count input of the reversible counter 40. These pulses establish the decay frequency of the tone signals on the output terminal 12; and, as with the case of the attack clock pulses, the decay frequency clock generator 52 is selected to produce pulses at a frequency corresponding to the desired decay frequencies. Depending upon the function, these frequencies can be relatively high, which means that the keyer turns off in a short time; or at a relatively low frequency which may stretch out the decay time to several seconds, such as for chime selection of the flute keyers. For keyers associated with chiff and celeste, the decay clock frequencies are typically hard wired, while for the flute keyers different decay clock frequencies may be selected by selection of the reverberation, sustain, or chime tabs of the electronic organ with which the keyer may be used. Selection of these different tabs changes the frequency of the decay clock pulses which are applied by the generator 52.

Irrespective of the frequency of the clock pulses, the operation of the circuit of FIG. 1 is the same. The decay clock pulses cause the reversible counter to count in its "up" direction from a count of zero to its maximum count of 63, the rate being dependent upon the decay clock frequency. As this count is increased, different combinations of the transistor switches 25 to 30 are rendered conductive and nonconductive in accordance with the binary pattern. The binary weighted resistors 15 to 20 thus are correspondingly connected in shunt in different patterns across the tone signal output to progressively change the attenuation of signals on the output terminal 12 in one decibel steps from its maximum level reached when the counter was at its count of zero to a minimum level reached when the counter attains its maximum or full count of 63. When the count of 63 is reached, all inputs to the AND gate 42 become high, and this causes the shunting transistor 31 once again to be rendered conductive to shunt the output terminal to ground. At the same time the inverter 43 applies a low or disabling input to the AND gate 44, preventing the further passage of decay clock pulses to the counter. The system thus is reset to its initial state of operation awaiting the next closure of the key 38, at which time the above cycle of operation will be repeated.

If following closure of the key 38, it is opened before the reversible counter 40 attains its minimum or zero count, the result is to immediately disable the AND gate 49 to prevent further passage of the attack clock pulses through that gate and to enable the AND gate 44 to immediately permit passage of the decay clock pulses to reverse the counter state. As a consequence, the decay of the tone signal output takes place from whatever point is reached on the attack waveform at the time the key 38 is opened.

By using a binary reversible counter 40 and by employing binary weighted relative values of the resistors 15 to 20, very smooth transition in one decibel steps is effected with the circuit of FIG. 1. However, if the large number of steps which are possible with a six stage reversible binary counter 40 are not desired or necessary, it is possible to use a reversible ring counter in place of the counter 40. In such an event the AND gate 42 and NAND gate 46 could be replaced by corresponding direct connections to the first and last stages of the counter to effect the same results. The counter outputs then would cause the switching transistors 25 to 30 to be rendered conductive one at a time in sequence as the count progressed in either the forward or reverse direction through such a counter. With this type of circuit, the resistors 15 to 20 would be arranged with the resistor 20 having a minimum value (for maximum attenuation) and the resistor 15 having a maximum value (for minimum attenuation of the tone signals on the output terminal 12). The values of the resistors 15 to 20 could be selected to cause the decibel change in the tone signal output for each step to be in accordance with predetermined steps or jumps to produce the desired waveform characteristics. Of course, if such a reversible ring counter is employed, more than six stages would be preferable to permit the desired flexibility of the waveform characteristics, and to prevent the attack or decay waveforms from taking place in such large steps as to produce audible pops or discontinuities in the tone signal output on the terminal 12. Otherwise, such a circuit would operate in the same manner as the one which is shown in FIG. 1.

Referring now to FIG. 2, there is shown another version of a digital keyer for controlling the attack and decay waveforms in which a series voltage divider circuit is employed instead of the parallel shunt arrangement of FIG. 1. In FIG. 2, the components which are the same or similar to components shown in FIG. 1 are given the same reference numbers as used in conjunction with the description of the circuit shown in FIG. 1. In the circuit of FIG. 2, tone signals from the tone signal input generator 10 are applied through the resistor 11 and through a series attenuator network 60 and a field-effect transistor (FET) switch 81 to the output terminal 12. The attenuator network 60 is coupled at each end through resistors 62 and 63 to ground to establish the operating point for the tone signal output appearing on the terminal 12.

In the quiescent condition of operation, with the key operated switch 38 open and the system in its stable state, all stages of the six stage reversible counter 40 produce a low output (in contrast with the high output of the circuit of FIG. 1 for the same condition). This output is inverted to a high output by inverters 74a to 79a, respectively. In such a condition, all of the series connected attenuator resistances 64, 65, 66, 67, 68 and 69 are effectively connected in series between the junction of the resistor 11 and the resistor 62 and the transistor switch 81, since shunting N-channel P-MOS FET switches 74 through 79, each connected across a different one of the resistors 64 to 69, respectively, all are nonconductive. This condition of operation exists when N-channel P-MOS field-effect transistors are employed in the circuit since such transistors are rendered conductive by the application of a low or negative potential to their gates and are rendered nonconductive by the application of a high or relatively positive potential to their gates.

All of the stages of the counter 40 are connected to corresponding inputs of a NAND gate 84 which produces a high output when all of the stages of the counter are low. This in turn is inverted by an inverter 85 to forward bias the N-channel FET switch 80 connected across the resistor 63 to apply ground potential to the output end of the divider network 60. At the same time, the output of the NAND gate 84 applies a high potential to the gate of the N-channel FET 81 causing it to be biased to its nonconductive state, effectively applying an open circuit between the end of the divider network and the tone signal output terminal 12. As a consequence, no tone signals are applied to the output 12 from the tone signal input generator 10.

As the same time, an AND gate 86, which also has inputs connected to each of the stages of the six stage reversible counter 40, has a low potential on its output and this is inverted by an inverter 87 to apply a high enabling input to the AND gate 49. Similarly, the high output of the NAND gate 84 is inverted by an inverter 89 to disable the AND gate 44.

When the key operates switch 38 is closed, the AND gate 49 passes the attack clock pulses from the clock generator 50 in the same manner described previously in conjunction with FIG. 1. In FIG. 2, however, these pulses are applied to the up input of the six stage reversible counter 40 instead of to the down input as described in conjunction with FIG. 1. This is because of the difference in the series and shunt voltage divider networks, so far as signal attenuation is concerned. When all of the transistors 25 to 30 of the circuit of FIG. 1 are conductive, maximum attenuation of the tone signal output was achieved. When all of the transistors 74 to 79 of the circuit of FIG. 2 are conductive, however, minimum attenuation of the tone signal output is achieved, since these transistors act as short circuit shunts between the tone signal input and the tone signal output instead of shunting signals through the resistors to ground. The operation of the circuit of FIG. 2, however, is otherwise similar to the operation of the circuit of FIG. 1, and the resistors 64 to 69 have relative weighted values in accordance with the binary count produced by the counter 40. Preferably, these values are selected to cause one decibel increments of the tone signal output to be achieved by the operation of the circuit in the same manner as described in FIG. 1. In FIG. 2, this is accomplished by shunting out different combinations of the resistors 64 to 69 whenever corresponding ones of the switching FET transistors 74 to 79 are rendered conductive.

The first count applied to the reversible counter 40 causes at least one of the outputs to go high which is in turn results in a low output from the NAND gate 84. This reverse biases the shunting transistor 80 and causes the transistor 81 to be rendered conductive. At the same time, the inverter 89 applies a high input to the AND gate 44 to enable it for subsequent operation. However, so long as the switch operated key 38 is held down, the inverter 54 prevents the passage of the decay clock pulses throught the AND gate 44.

When the counter 40 reaches its maximum count, all staages high, minimum attenuation of the signals from the tone signal generator is achieved since all of the transistors 74 to 79 are conductive, thereby shunting or short circuiting all of the resistors 65 to 69 in the resistor divider chain. At the same time, the high output from the AND gate 86 is inverted by the inverter 87 to disable the AND gate 49, in a manner similar to that described in conjunction with FIG. 1. No more clock pulses are applied to the counter from either generator 50 or 52 for the remainder of the time this key 38 is held closed.

Upon subsequent release of the key 38, the AND gate 49 remains disabled, due to the low potential applied to it by the key release; but the inverter 54 enables the AND gate 44 to pass the decay clock pulses to the down count input of the reversible counter 40. The counter 40 then reverses direction, causing different binary combinations of the shunting switch transistors 74 to 79 to be rendered conductive to cause the decay of the tone signal output to take place in one decibel steps at a frequency determined by the frequency selected for the decay clock generator 52. To this extent, the operation of the circuit of FIG. 2 is similar to that achieved by the circuit of FIG. 1.

It has been found, however, that the attack waveform need not progress in one decibel steps, and it also is desirable in many cases to cause the attack to take place in less than the number of steps which are required to advance the counter 40 through its entire count from a minimum to a maximum count in shaping the attack waveform. In the circuit of FIG. 2, the attack waveform is modified by employing an attack memory circuit 90 which preferably is an ROM (Read only memory), is pre-programmed to establish a particular attack waveform sequence. The attack memory 90 has six outputs, each connected to a different one of the stages of the six stage reversible counter. It also includes an input connected to the output side of the key operated switch 38.

When the key operated switch 38 initially is closed, a positive potential pulse is applied from the supply terminal 56 through a lead 92 to the input of a monostable multivibrator 94 which applies a pulse on a lead 96 to the attack memory 90. In its simplest form, the attack memory 90 includes pre-wired diode interconnections between the lead 92 and selected ones of the outputs to cause trigger pulses to be applied to selected stages of the counter 40 when the key 38 initially is closed. These inputs reverse the state of those stages to store an initial count in the counter 40. This count, of course, is reflected in the conditions of the outputs of the six stages of the counter 40 and immediately applies a pre-selected attenuation to the signals applied to the tone signal output terminal 12. This attenuation is substantially less than that which is applied by the counter 40 when it is set to its minimum or zero count.

Typically, it has been found that this first or initial count can be selected to provide approximately −31 decibels attenuation to the tone signal to start the attack waveform at this point. For the simplest form of the attack memory 90 as described, further operation of the reversible counter 44 for generating the remainder attack waveform takes place in one decibel steps as the counter is advanced by the application of attack clock pulses on the up count input of the counter.

It should be noted that the setting of the stages of the counter 40 by the memory 90 takes place only upon the application of a pulse on the lead 92 and no further pulses will appear during the attack, sustain and decay waveforms since a pulse appears on the lead 92 only when the key 38 initially is closed to initiate the generation of the tone signal output for the keyer. There is no affect on the decay operation of the circuit by the attack memory 90.

It also is desirable, in some cases, to further modify the shape of the attack waveform in accordance with the changing stages of the six stage reversible counter. To accomplish this, each of the six outputs of the reversible counter 40 also are connected to six additional inputs of the attack memory 90. The output conditions of the stages of the reversible counter 40 then are compared in the memory 90 with preset conditions in coincidence gates to cause additional pulses to be selectively applied on the output leads of the attack memory 90 to the individual stages of the reversible counter 40. This causes those selected stages to be reset to different states, modifying the pattern of the attack waveform. This means that increments other than one decibel can be obtained in response to individual clock pulses. Once the maximum count is attained by the counter 40, however, the system operates in the same manner described previously; and the attack memory 90 has no affect on the subsequent operation of the attenuator network in its sustain or decay mode.

Figure 3:
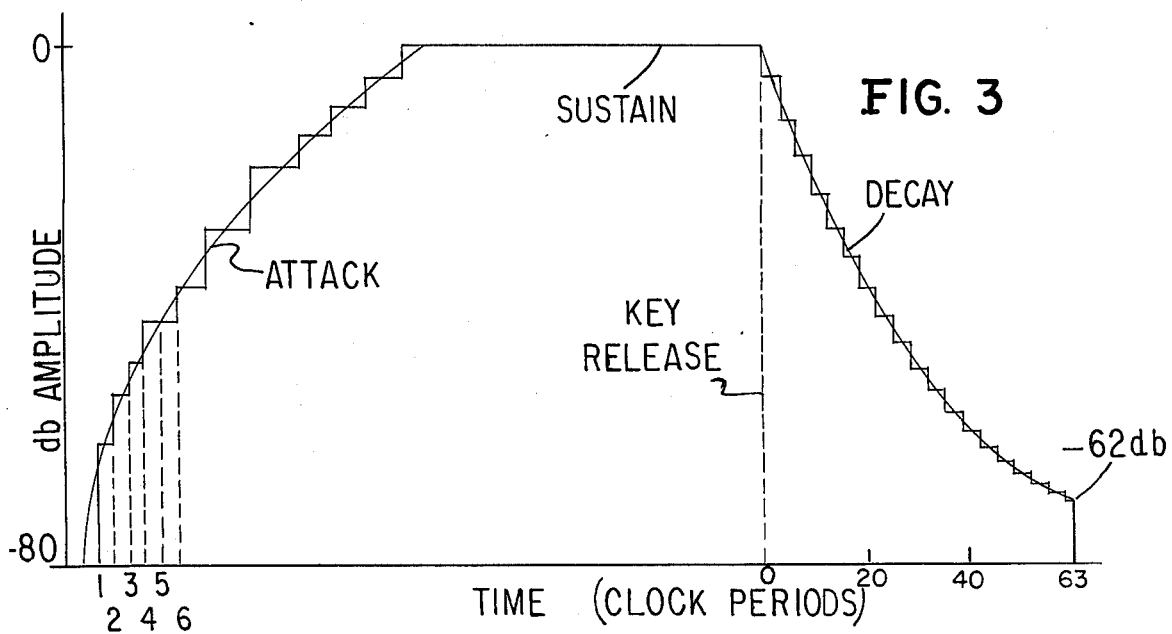
FIG. 3 is a waveform showing a characteristic tone curve obtained in accordance with operation of the embodiment shown in FIG. 2.

In FIG. 3, the waveform characteristics of the operation of the circuit of FIg. 2 are shown in a representative manner. The attack waveform is illustrated as immediately rising to a relatively high intermediate value (typically −31DB) in response to the application of the first clock pulse. It can be seen that the attack waveform frequency does not necessarily follow one decibel increments, although such increments would be obtained with a simple attack memory which only set the initial condition into the counter 40 and did not continuously monitor and change the state of the counter 40. Once the maximum level (minimum attenuation) condition is reached when the counter 40 is set to its highest count, the tone signal output remains at its sustain level (essentially zero DB attenuation which is illustrated by the central portion of the waveform in FIG. 3. Upon release of the key, the decay mode of operation takes place, with the attenuation being effected in one decibel increments to reduce the attenuation from zero decibel to −62DB for a six state reversible counter. When the 63rd pulse is counted, all of the outputs of the counter 40 go low, causing the NAND gate 84 to drive the transistor 80 conductive and the transistor 81 nonconductive. This reduces the tone signal output to its open circuit or minimum condition which is set at approximately −80DB. This last drop from −62DB to −80DB in one step, however, is not noticeable due to the extremely low level of the signal which is present at −62DB. This is true even for long decay times such as are used with flute keyers in conjunction with a chime decay frequency of several seconds.

Also, if P-channel FET's were used in the circuit of FIG. 2, the inverted counter outputs would be used and the gate 84 would be an AND gate and the gate 86 would be a NAND gate.

I claim:

1. A tone-shaping attenuator network for use with an electronic musical instrument including in combination:
   a signal input terminal adapted to receive tone input signals;
   a signal output terminal from which output tone signals are obtained;
   a voltage divider network including a plurality of resistors connected in series between said signal input terminal and said signal output terminal and further including a corresponding plurality of short-circuiting switches, each coupled in parallel with a different one of said plurality of resistors, each switch having a control electrode and rendered conductive and nonconductive in accordance with control voltages applied to such control electrode;
   circuit means, the operative state of which changes in response to close pulses applied thereto, having a plurality of outputs connected to the respective control electrodes of different ones of said switch elements for controlling the conductivity of said switch elements in accordance with the operative state of said circuit means;
   a key-operated control switch;
   at least one clock pulse generating means for producing clock pulses;
   first coincidence gate means having an output coupled to said circuit means for supplying clock pulses thereto and having at least first and second inputs coupled to said clock pulse generator and said key-operated switch means, respectively, for controlling the application of clock pulses to said circuit means in response to operation of said key-operated control switch;
   means coupled with said circuit means and responsive to the outputs thereof for terminating changes in the operative state of said circuit means in response to a predetermined state of such outputs.

2. The combination according to claim 1 wherein said resistors cause the attenuation between said signal input terminal and said signal output terminal to vary in accordance with a predetermined pattern established by the relative conductive and nonconductive states of said short-circuiting switches.

3. The combination according to claim 1 wherein said circuit means comprises a reversible binary counter with a first clock input for operating the counter in one direction and a second clock input for operating the counter in the opposite direction; and said first gate means comprises first and second gates each having a first input coupled with said clock pulse generating means and a second input coupled with said key operated control switch, said first gate rendered operative to pass clock pulses to the first clock input of said counter upon closure of said key operated control switch means with said second gate being rendered inoperative by said closure, and said second gate rendered operative to pass clock pulses to the second clock input of said counter upon release of said key operated control switch, said first gate being rendered inoperative to pass clock pulses upon such release of said control switch.

4. The combination according to claim 3 wherein said first and second gates each have a third input, and further including third and fourth coincidence gates, with the third input of said first gate coupled with output of said third coincidence gate and with the third input of said second gate coupled with the output of said fourth coincidence gate, said first and second gates being disabled to prevent the passage of clock pulses therethrough whenever an output is obtained from the respective third and fourth coincidence gates coupled therewith.

5. The combination according to claim 4 wherein the output of said first gate is connected to drive the counter in its up count direction and the output of said second coincidence gate is connected to the counter to drive it in its down count direction, the counter outputs connected with said short-circuiting switches operating to cause said attenuation between said input terminal and said output terminal to vary from a maximum amount to a minimum amount when said counter is operated in its up count direction and to vary from a minimum amount to a maximum amount when said counter is being operated in its down count direction, and said third coincidence gate is responsive to a predetermined maximum count in said counter for producing an output signal applied to disable said first gate, and further including switch means connected to said fourth coincidence gate for shunting the output end of said voltage divider to ground and for open circuiting the connection between said voltage divider and said output terminal in response to an output signal from said fourth coincidence gate.

6. The combination according to claim 3 wherein the values of resistance of said resistors are related according to binary number progression to produce varying attenuation between said input terminal and said output terminal in predetermined steps in accordance with the count represented on the outputs of said reversible counter.

7. The combination according to claim 3 further including an attack memory circuit means having predetermined outputs coupled with predetermined stages of said reversible binary counter, said attack memory circuit means having an input coupled with said key operated control switch and responsive to closure of said key operated control switch for setting a predetermined initial count into said reversible counter in response to such closure.

8. The combination according to claim 7 further including means connecting selected ones of the outputs of said binary counter with said memory circuit for causing said memory circuit to apply output signals to selected stages of said counter to modify the count in said counter in accordance with a preselected pattern determined by the states of the output of said counter, said memory circuit means being disabled when said key operated control switch is released to prevent such modification of the count in said counter when it is operated in the down count direction.

9. The combination according to claim 3 wherein said clock pulse generating means includes a first clock pulse generator supplying clock pulses at a first frequency coupled with said first gate to determine the frequency of operation of said reversible counter when said key operated control switch is closed to shape an attack envelope of the output tone signal and further including a second clock pulse generator producing clock pulses at a second predetermined frequency coupled to said second gate to shape a decay envelope of the output tone signal when said reversible counter is operated in its down mode of operation.

10. An attenuator network for use with an electronic musical instrument including in combination:
   a signal input terminal adapted to receive input signals;
   a signal output terminal coupled with said signal input terminal;
   a variable attenuator network including a plurality of interconnected resistor means coupled with the output terminal and having predetermined values of resistance corresponding to different increments of attenuation, and also including a plurality of voltage-controlled switch means each connected respectively in series with a different one of said resistor means between said output terminal and a point of reference potential;
   a reversible counter circuit means operated to count in one direction in response to clock pulses applied to a first input and to count in the opposite direction in response to clock pulses applied to a second input, said counter circuit means having a predetermined number of stages, each having an output coupled with a different one of said voltage controlled switch means for rendering said voltage controlled switch means conductive and nonconductive in accordance with the count in said counter circuit means;
   a key operated control switch;
   clock pulse generator means for producing clock pulses;
   first gate means having an output coupled with the first input of said reversible counter circuit means for supplying clock pulses thereto and having at least first and second inputs, with the first input coupled with the output of said clock pulse generating means and the second input coupled with said key operated control switch and responsive to operation thereof for controlling the application of clock pulses through said first gate means to the first input of said counter;
   second gate means having an output coupled with the second input of said reversible counter circuit means for supplying clock pulses thereto and having at least first and second inputs, with the first input coupled with the output of said clock pulse generating means and the second input coupled with said key operated control switch and responsive to release of said control switch for controlling the application of clock pulses through said second gate means to the second input of said reversible counter from said clock pulse generator means.

11. The combination according to claim 10 further including means coupled with the outputs of said reversible counter and responsive to predetermined counts represented on said outputs for disabling said first gate in response to a first predetermined count and for disabling said second gate in response to a second predetermined count.

12. The combination according to claim 10 wherein said point of reference potential is ground potential and said switch means are transistors, the collector-emitter path of each of which is connected in series with a different one of said resistor means between said signal output terminal and said point of reference potential, and the bases of which are connected respectively with different outputs of said reversible counter circuit means.

13. A tone-shaping attenuator network for use with an electronic musical instrument for varying the attenuation of tone signals according to a predetermined pattern, including in combination:
   a signal input terminal adapted to receive input signals;
   a signal output terminal coupled with said signal input terminal;
   a voltage divider network coupled with said signal output terminal and having a plurality of interconnected resistor elements and a like plurality of switch elements, each switch element connected with a different one of said resistor elements for effectively causing said voltage divider network to vary the signal attenuation between said signal input terminal and said signal output terminal in accordance with the state of operation of said switch elements;
   a reversible binary counter having first and second input terminals and operated in response to clock pulses applied to said input terminals to count in one direction in response to clock pulses on said first input terminal and to count in the opposite direction in response to clock pulses applied to the second input terminal, said counter having outputs coupled with said switch elements for controlling the state of operation thereof according to the count in said counter;
   a control switch;
   clock pulse generating means for producing clock pulses;
   first and second gate means, each having an output, with the output of said first gate means coupled with said first input of said counter and the output of said second gate means coupled with the second input of said counter, for supplying clock pulses to the first and second inputs, respectively, of said counter, each of said gate means having at least first and second inputs with said clock pulse generating means coupled with the first input of each of said gate means and with said control switch coupled with the second input of each of said gate means, said first gate means being responsive to operation of said control switch for passing clock pulses therethrough to its output, and said second gate means being responsive to release of said control switch for passing clock pulses therethrough to its output.

14. The combination according to claim 13 wherein each of said resistor elements of said voltage divider network is connected in series with a corresponding one of said plurality of switch elements between said signal output terminal and a point of reference potential.

15. The combination according to claim 14 wherein said switch elements comprise semiconductor switch elements, each having a control electrode and rendered conductive and nonconductive is accordance with a potential applied to said control electrode, and said reversible binary counter has a plurality of outputs each coupled with the control electrode of a different one of said semiconductor switch means.

16. The combination according to claim 13 wherein said plurality of resistor elements are connected in series circuit between said input terminal and said output terminal, and said switch elements comprise short circuiting switch elements each connected in parallel with a different one of said resistor elements.

17. The combination according to claim 16 wherein said switch elements each comprise a semiconductor switch element having a control electrode and rendered conductive and nonconductive in accordance with a potential applied to the control electrode thereof.

18. The combination according to claim 17 wherein said binary counter has a plurality of outputs each coupled with the control electrode of a different semiconductor switch element for selectively applying control potentials to the control electrodes of said switch elements for short-circuiting selected ones of said resistor elements in accordance with said binary counter outputs.

* * * * *